United States Patent
Han et al.

(10) Patent No.: US 12,004,385 B2
(45) Date of Patent: Jun. 4, 2024

(54) DISPLAY SUBSTRATE, DISPLAY PANEL AND DISPLAY DEVICE

(71) Applicant: BOE Technology Group Co., Ltd., Beijing (CN)

(72) Inventors: Ying Han, Beijing (CN); Yicheng Lin, Beijing (CN); Pan Xu, Beijing (CN); Xing Zhang, Beijing (CN); Zhan Gao, Beijing (CN); Guang Yan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 424 days.

(21) Appl. No.: 17/418,814

(22) PCT Filed: Nov. 13, 2020

(86) PCT No.: PCT/CN2020/128766
§ 371 (c)(1),
(2) Date: Jun. 26, 2021

(87) PCT Pub. No.: WO2021/104050
PCT Pub. Date: Jun. 3, 2021

(65) Prior Publication Data
US 2022/0123083 A1    Apr. 21, 2022

(30) Foreign Application Priority Data
Nov. 26, 2019    (CN) .......................... 201911171911.X (51) Int. Cl.
*H10K 59/13*    (2023.01)
*H10K 59/122*    (2023.01)
(Continued)

(52) U.S. Cl.
CPC ........... *H10K 59/13* (2023.02); *H10K 59/122* (2023.02); *H10K 59/124* (2023.02);
(Continued)

(58) Field of Classification Search
CPC .... H10K 59/13; H10K 59/122; H10K 59/124; H10K 59/131; H10K 59/38;
(Continued)

(56) References Cited

U.S. PATENT DOCUMENTS

| 2011/0221720 A1 | 9/2011 | Kuo et al. |
| 2015/0364527 A1 | 12/2015 | Wang et al. |

(Continued)

FOREIGN PATENT DOCUMENTS

| CN | 101976679 A | 2/2011 |
| CN | 104362168 A | 2/2015 |

(Continued)

OTHER PUBLICATIONS

CN201911171911.X first office action.

*Primary Examiner* — Yasser A Abdelaziez
(74) *Attorney, Agent, or Firm* — IPro, PLLC (57) ABSTRACT

Provided is a display substrate including a substrate, and a light-emitting device and an optical compensation structure which are located on the substrate. The optical compensation structure includes a photoelectric sensor, a transistor and a capacitor, and the photoelectric sensor is electrically connected to the transistor and the capacitor respectively. The photoelectric sensor includes a first electrode, a photosensitive layer located on a side of the first electrode distal from the substrate, and a second electrode located on a side of the photosensitive layer distal from the substrate; the transistor includes a source electrode, a drain electrode, a gate electrode and an active layer; and the capacitor includes a first electrode plate and a second electrode plate located on a side of the first electrode plate distal from the substrate.

15 Claims, 8 Drawing Sheets

(51) Int. Cl.
*H10K 59/124* (2023.01)
*H10K 59/131* (2023.01)
*H10K 59/38* (2023.01)
*H10K 71/00* (2023.01)
*H10K 59/12* (2023.01)

(52) U.S. Cl.
CPC ........... *H10K 59/131* (2023.02); *H10K 59/38* (2023.02); *H10K 71/00* (2023.02); *H10K 59/1201* (2023.02)

(58) Field of Classification Search
CPC ............. H10K 59/1201; H10K 59/126; H10K 59/121; H10K 59/60; H10K 59/00; H10K 71/00; H10K 59/12

See application file for complete search history.

(56) References Cited

U.S. PATENT DOCUMENTS

| | | |
|---|---|---|
| 2016/0322450 A1 | 11/2016 | Lee et al. |
| 2018/0053032 A1 | 2/2018 | Ding et al. |
| 2020/0091253 A1 | 3/2020 | Liu et al. |
| 2021/0280645 A1* | 9/2021 | Wang ..................... H10K 71/00 |
| 2021/0335238 A1* | 10/2021 | Song ..................... H10K 71/00 |
| 2021/0335917 A1 | 10/2021 | Wang |
| 2021/0366394 A1 | 11/2021 | Gai et al. |

FOREIGN PATENT DOCUMENTS

| | | |
|---|---|---|
| CN | 105304673 A | 2/2016 |
| CN | 108538255 A | 9/2018 |
| CN | 108987455 A | 12/2018 |
| CN | 109285870 A | 1/2019 |
| CN | 110660356 A | 1/2020 |
| CN | 110867473 A | 3/2020 |

* cited by examiner

DISPLAY SUBSTRATE, DISPLAY PANEL AND DISPLAY DEVICE

CROSS-REFERENCE TO RELATED APPLICATION

This application is a US national stage of PCT international patent application No. PCT/CN2020/128766 filed on Dec. 13, 2020, which claims priority to the Chinese Patent Application No. 201911171911.X, filed on Nov. 26, 2019 and entitled "DISPLAY SUBSTRATE, DISPLAY PANEL AND DISPLAY DEVICE", the disclosures of which are herein incorporated by reference in their entireties.

TECHNICAL FIELD

The present disclosure relates to a display substrate, a display panel and a display device.

BACKGROUND

In recent years, organic light-emitting diode (OLED)-based display devices have become popular all around the world due to their advantages such as self-luminescence, wide view angle, high luminous efficiency, wide color gamut, low working voltage, thin panel, and the like.

SUMMARY

According to at least one embodiment of the present disclosure, a display substrate is provided. The display substrate includes a substrate, and a light-emitting device and an optical compensation structure which are located on the substrate, wherein
the optical compensation structure includes a photoelectric sensor, a transistor and a capacitor, and the photoelectric sensor is electrically connected to the transistor and the capacitor respectively;
the photoelectric sensor comprises a first electrode, a photosensitive layer located on a side of the first electrode distal from the substrate, and a second electrode located on a side of the photosensitive layer distal from the substrate; the transistor comprises a source electrode, a drain electrode, a gate electrode and an active layer; the capacitor comprises a first electrode plate and a second electrode plate located on a side of the first electrode plate distal from the substrate; and
neither an orthographic projection of the source electrode onto the substrate nor an orthographic projection of the drain electrode onto the substrate overlaps with an orthographic projection of the first electrode plate onto the substrate, and both the orthographic projection of the source electrode onto the substrate and the orthographic projection of the drain electrode onto the substrate overlap with an orthographic projection of the first electrode onto the substrate.

In an embodiment, an orthographic projection of the active layer onto the substrate overlaps with an orthographic projection of the photosensitive layer onto the substrate.

In another embodiment, the orthographic projection of the active layer onto the substrate is within the orthographic projection of the photosensitive layer onto the substrate.

In another embodiment, the source electrode, the source electrode, the drain electrode and the first electrode plate are located in a same layer.

In another embodiment, the first electrode and the second electrode plate are located in a same layer.

In another embodiment, the display substrate further includes an insulating layer located on a side of the photoelectric sensor proximal to the substrate, the insulating layer comprising a first passivation layer, a planarizing layer located on a side of the first passivation layer distal from the substrate, and a second passivation layer located on a side of the planarizing layer distal from the substrate.

In another embodiment, the transistor is located on a side of the insulating layer proximal to the substrate, a contact hole is defined in the insulating layer, and the first electrode and the source electrode are electrically connected through the contact hole.

In another embodiment, a material of the planarizing layer is one selected from a Silicon On Glass (SOG) material or a resin.

In another embodiment, the material of the planarizing layer is a SOG material, and the second passivation layer covers a surface of a side of the planarizing layer distal from the substrate and a side wall of the planarizing layer.

In another embodiment, an orthographic projection of the photoelectric sensor onto the substrate is within an orthographic projection of the planarizing layer onto the substrate.

In another embodiment, an orthographic projection of the photosensitive layer onto the substrate is within the orthographic projection of the first electrode onto the substrate.

In another embodiment, an orthographic projection of the second electrode onto the substrate is within an orthographic projection of the photosensitive layer onto the substrate.

In another embodiment, the light-emitting device is located on a side of the photoelectric sensor distal from the substrate, and the light-emitting device comprises an anode, an insulating layer is provided between the second electrode and the anode, and a through hole is defined in the insulating layer; and
the display substrate further comprises a lead wire, the lead wire and the anode are located in a same layer, and one end of the lead wire is electrically connected to the second electrode through the through hole.

In another embodiment, the display substrate further comprises a color filter layer located between the light-emitting device and the photoelectric sensor, and an orthographic projection of the color filter layer onto the substrate does not overlap with an orthographic projection of the photoelectric sensor onto the substrate.

According to at least one embodiment of the present disclosure, a display panel is provided, wherein the display panel includes the above display substrate.

According to at least one embodiment of the present disclosure, a display device is provided, wherein the display device includes the above display panel.

DETAILED DESCRIPTION

Detailed descriptions will now be made to exemplary embodiments, examples of which are illustrated in the accompanying drawings. When the following description refers to the accompanying drawings, the same numbers in different drawings represent the same or similar elements, unless otherwise indicated. The embodiments set forth in the following exemplary embodiments do not represent all embodiments consistent with the present disclosure. Instead, they are merely examples of devices and methods consistent with some aspects of the present disclosure and as recited in the appended claims.

The terms used herein are for the purpose of illustrating the specific embodiments only, rather than limiting the present disclosure. The terms "a", "the" and "this" of singular forms used in the present disclosure and the attached claims are also intended to include their plural forms, unless otherwise clearly specified in the context. It can also be appreciated that the term "and/or" as used herein refers to any or all possible combinations of one or more associated items as listed.

It can be appreciated that although the terms "first", "second" and "third" and so on may be used in the present disclosure to describe various kinds of information, such information should not be limited to these terms. These terms are only configured to distinguish between different information of the same category. For example, without departing from the scope of the present disclosure, first information may also be referred to as second information, and similarly, the second information may also be referred to as the first information. Depending on the context, the term "if" as used herein may be interpreted as "in a case that" or "when" or "in response to determining".

Some embodiments of the present disclosure will be described in detail with reference to the accompanying drawings. The following embodiments and features in the embodiments may be combined with each other when there is no conflict.

In the related art, after a display panel is manufactured, the luminance of its display screen is generally non-uniform, which would adversely influence user experience. Therefore, it is necessary to conduct a luminance compensation on the display panel, so as to make the luminance all over the display screen of the display panel to be uniform.

Figure 1:
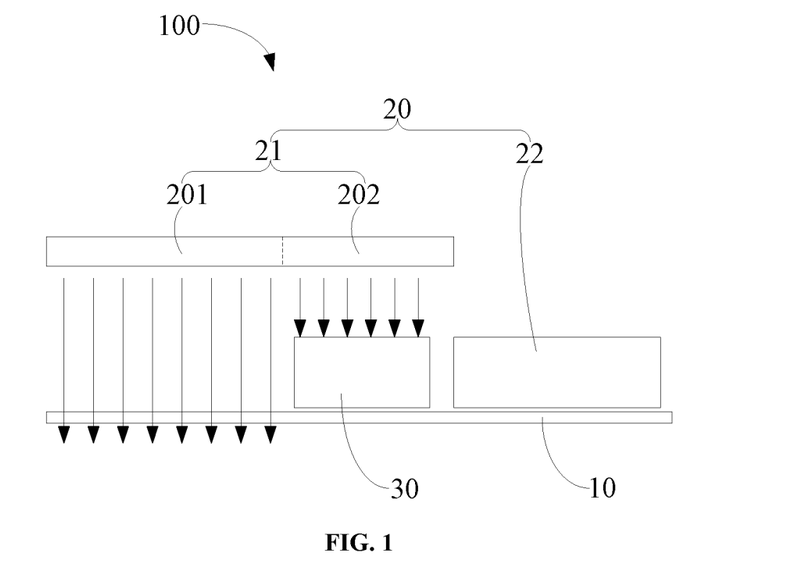
FIG. 1 is a schematic structural diagram of a display substrate according to an exemplary embodiment of the present disclosure.

According to an embodiment of the present disclosure, a display substrate is provided. Referring to FIG. 1, the display substrate 100 includes a substrate 10, and a light-emitting device 21 and an optical compensation structure 30 which are disposed on the substrate 10.

Figure 2:
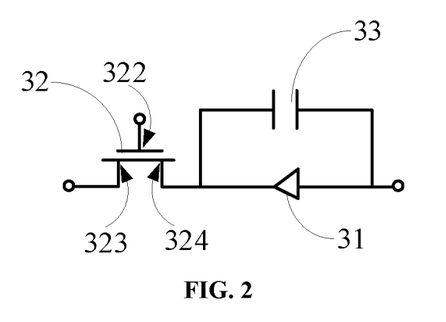
FIG. 2 is a circuit diagram of an optical compensation structure according to an exemplary embodiment of the present disclosure.
Figure 3:
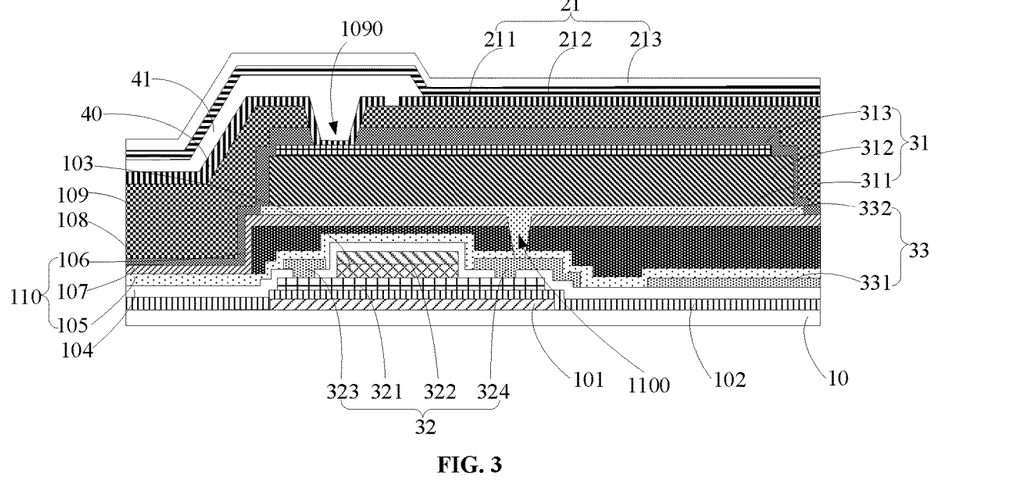
FIG. 3 is a sectional view of a display substrate according to an exemplary embodiment of the present disclosure.
Figure 4:
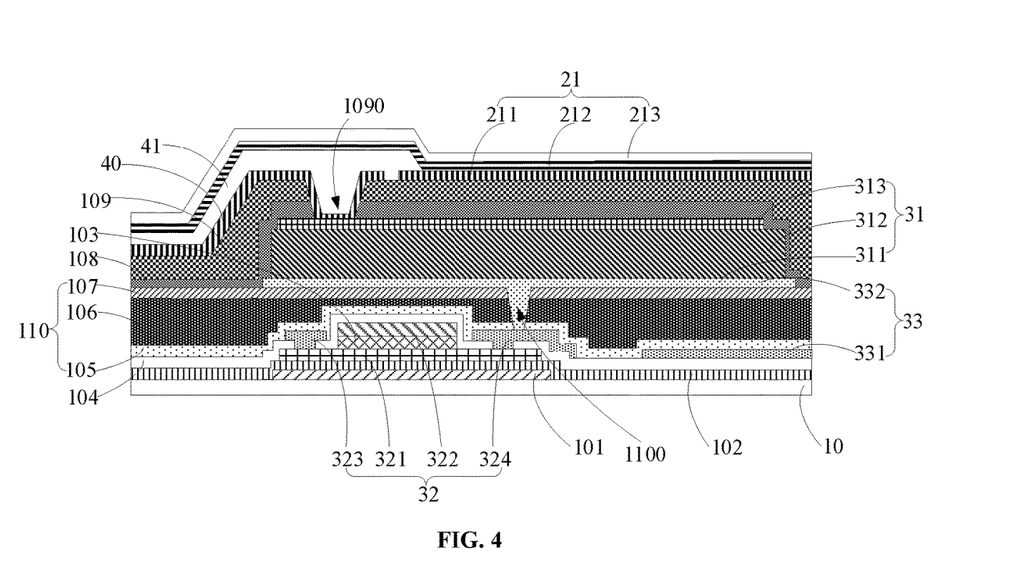
FIG. 4 is another sectional view of the display substrate according to an exemplary embodiment of the present disclosure.

Referring to FIG. 2, the optical compensation structure 30 includes a photoelectric sensor 31, a transistor 32 and a capacitor 33. The photoelectric sensor 31 is configured to collect an intensity of light emitted by the light-emitting device 21. Referring to FIGS. 3 and 4, the photoelectric sensor 31 includes a first electrode 311, a photosensitive layer 312 disposed on a side of the first electrode 311 distal from the substrate 10, and a second electrode 313 disposed on a side of the photosensitive layer 312 distal from the substrate 10. The transistor 32 includes an active layer 321, a gate electrode 322, a drain electrode 323 and a source electrode 324. The capacitor 33 includes a first electrode plate 331 and a second electrode plate 332 disposed on a side of the first electrode plate 331 distal from the substrate 10.

Neither an orthographic projection of the source electrode 324 of the transistor 32 onto the substrate 10 nor an orthographic projection of the drain electrode 323 of the transistor 32 onto the substrate 10 overlaps with an orthographic projection of the first electrode plate 331 of the capacitor 33 onto the substrate 10, and both the orthographic projection of the source electrode 324 of the transistor 32 onto the substrate 10 and the orthographic projection of the drain electrode 323 of the transistor 32 onto the substrate 10 overlap with an orthographic projection of the first electrode 311 of the photoelectric sensor 31 onto the substrate 10.

In the display substrate according to the embodiment of the present disclosure, the optical compensation structure 30 collects the intensity of the light emitted by the light-emitting device 21 to perform a luminance compensation on the light-emitting device 21, such that the luminous intensities of all the light-emitting devices 21 in the display substrate are consistent, further making the luminance all over the display screen of the display substrate uniform. Since the optical compensation structure 30 directly acquires the luminance difference among the respective light-emitting devices 21 so as to perform the luminance compensation on them, the problem of non-uniform luminance caused by various factors can be solved. Compared with the solution of electrical compensation which can only solve the problem of non-uniform luminance caused by the threshold voltage and mobility, the solution according to the embodiment of the present disclosure provides a more comprehensive luminance compensation solution. As neither the orthographic projection of the source electrode 324 of the transistor 32 onto the substrate 10 nor the orthographic projection of the drain electrode 323 onto the substrate 10 overlaps with the orthographic projection of the first electrode plate 331 of the capacitor 33 onto the substrate 10, the source electrode 324, the drain electrode 323 and the first electrode plate 331 can be manufactured in a same layer, and thus can be formed in a same process, which helps to simplify the manufacturing process. As the orthographic projection of the source electrode 324 onto the substrate 10 and the orthographic projection of the drain electrode 323 onto the substrate 10 overlap with the orthographic projection of the first electrode 311 onto the substrate 10, the space of the display substrate can be saved.

In an embodiment, the orthographic projection of the active layer 321 of the transistor 32 onto the substrate 10 overlaps with the orthographic projection of the photosensitive layer 312 of the photoelectric sensor 31 onto the substrate 10. Since the orthographic projection of the active layer 321 of the transistor 32 onto the substrate 10 overlaps with the orthographic projection of the photoelectric sensor 31 onto the substrate 10, the space of the display substrate can be saved. As such, when the total area of the orthographic projections of the active layer 321 and the photoelectric sensor 31 onto the substrate is fixed, the light receiving surface of the photoelectric sensor 31 can be larger as compared to the solution in which the orthographic projection of the active layer 321 onto the substrate 10 does not overlap with the orthographic projection of the photoelectric sensor 31 onto the substrate 10, thereby facilitating the improvement of the detection accuracy of the photoelectric sensor 31.

Optionally, the orthographic projection of the active layer 321 of the transistor 32 onto the substrate 10 is within the orthographic projection of the photosensitive layer 312 of the photoelectric sensor 31 onto the substrate 10. In this way, the space of the display substrate can be saved to the greatest extent.

In an embodiment, the source electrode 324 and the drain electrode 323 of the transistor 32 are disposed in the same layer as the first electrode plate 331 of the capacitor 33. By disposing the source electrode 324, the drain electrode 323 and the first electrode plate 331 in a same layer, it means that the source electrode 324, the drain electrode 323 and the first electrode plate 331 are made of the same material and are formed at the same time. That is, the source electrode 324, the drain electrode 323 and the first electrode plate 331 may be formed in a same process, which is helpful in simplifying the manufacturing process.

In an embodiment, the first electrode 311 of the photoelectric sensor 31 and the second electrode plate 332 of the capacitor 33 are disposed in a same layer. By disposing the first electrode 311 and the second electrode plate 332 in a same layer, it means that the first electrode 311 and the second electrode plate 332 are made of the same material and are formed at the same time. That is, the first electrode 311 and the second electrode plate 332 may be formed in a same process, which is helpful in simplifying the manufacturing process.

FIG. 2 is a schematic diagram of a circuit formed by connecting the photoelectric sensor 31, the transistor 32 and the capacitor 33 of the optical compensation structure. As shown in FIG. 2, the capacitor 33 is connected in parallel with the photoelectric sensor 31. That is, one electrode plate of the capacitor 33 is electrically connected to an input end of the photoelectric sensor 31, and the other electrode plate of the capacitor 33 is electrically connected to an output end of the photoelectric sensor 32. An input end of the photoelectric sensor 31 is connected to a high-level power line of an external power source, and an output end of the photoelectric sensor 31 is electrically connected to the source electrode 324 of the transistor 32; and the drain electrode 323 of the transistor 32 is electrically connected to a chip, and the gate electrode 322 of the transistor 32 is connected to a switch signal line. The setting of the capacitor 33 is beneficial to the luminance detection and compensation under a high gray level.

In an embodiment, the display substrate 100 is an OLED display substrate. The pixel 20 of the display substrate 100 further includes a pixel circuit 22 for driving the light-emitting device 21, wherein the pixel circuit 22 and the light-emitting device 21 are electrically connected.

Figure 5:
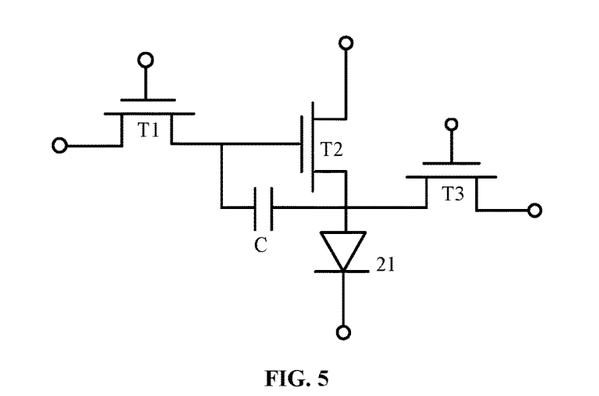
FIG. 5 is a circuit diagram of a pixel circuit according to an exemplary embodiment of the present disclosure.

FIG. 5 is a schematic structural diagram of the pixel circuit 22. Referring to FIG. 5, the pixel circuit is a 3T1C circuit which includes three transistors and one capacitor. A gate electrode of the transistor T1 is connected to a scan line, a first end of the transistor T1 is connected to a data line, and a second end of the transistor T1 is electrically connected to a gate electrode of the transistor T2. A first end of the transistor T2 is electrically connected to a high level, and a second end of the transistor T2 is electrically connected to the light-emitting device 21. A gate electrode of the transistor T3 is connected to the scan line, a first end of the transistor T3 is electrically connected to the second end of the transistor T2, and a second end of the transistor T3 is connected to a reset signal line. One end of the capacitor C is connected to the gate electrode of the transistor T2, and the other end of the capacitor C is connected to the second end of the transistor T2. In other embodiments, the pixel circuit 22 may alternatively be a 2T1C circuit (including two transistors and one capacitor), a 7T1C circuit (including seven transistors and one capacitor), a 7T2C circuit (including seven transistors and two capacitors), or the like.

The photoelectric sensor 31 is disposed on a light exiting side of the light-emitting device 21, and is configured to acquire the luminous intensity of the light-emitting device 21. The display substrate 100 provided by the embodiment of the present disclosure may be a bottom light-emitting display substrate, wherein the light emitted by the light-emitting structure 20 is emitted out through the substrate 10. As shown in FIG. 1, the light-emitting device 21 may be divided into a first region 201 and a second region 202. An orthographic projection of the first region 201 onto the substrate 10 does not overlap with the orthographic projection of the photoelectric sensor 31 of the optical compensation structure 30 onto the substrate 10. In addition, the orthographic projection of the photoelectric sensor 31 of the optical compensation structure 30 onto the substrate 10 falls within an orthographic projection of the second region 202 onto the substrate 10, as such, light emitted from the second region 202 of the light-emitting device 21 is partially received by the photoelectric sensor 31, and light emitted from the first region 201 of the light-emitting device 21 is emitted out through the substrate 10.

Referring to FIGS. 3 and 4, the light-emitting device 21 includes an anode 211, an organic layer 212 disposed on a side of the anode 211 distal from the substrate 10, and a cathode 213 disposed on a side of the organic layer 212 distal from the substrate 10. In the illustrated embodiment, the display substrate 100 is a bottom light-emitting display substrate, and a material of the anode 211 is a light-transmitting material.

In an embodiment, the photoelectric sensor 31 is a photodiode. The photodiode is fast in response and provides more stable operation.

In an embodiment, the display substrate 100 further includes an insulating layer 110 disposed on a side of the photoelectric sensor 21 proximal to the substrate 10. The insulating layer 110 includes a first passivation layer 105, a planarizing layer 106 disposed on a side of the first passivation layer 105 distal from the substrate 10, and a second passivation layer 107 disposed on a side of the planarizing layer 106 distal from the substrate 10. The planarizing layer 106 can ensure that the bottom of the photoelectric sensor 21 is flat, which is helpful in reducing the dark current of the photoelectric sensor 31.

In an embodiment, the orthographic projection of the photoelectric sensor 31 onto the substrate 10 is within an orthographic projection of the planarizing layer 106 onto the substrate 10. By disposing the orthographic projection of the photoelectric sensor 31 onto the substrate 10 within the orthographic projection of the planarizing layer 106 onto the substrate 10, it means that all of the orthographic projections of the first electrode 311, the photosensitive layer 312 and the second electrode 313 of the photoelectric sensor 31 onto the substrate 10 are within the orthographic projection of the planarizing layer 106 onto the substrate 10. In this way, the planarizing layer 106 can prevent ambient light from being incident to the photoelectric sensor 31, so as to avid the signal interference detected by the photoelectric sensor 31, which is helpful in improving the signal-to-noise ratio.

Figure 7:
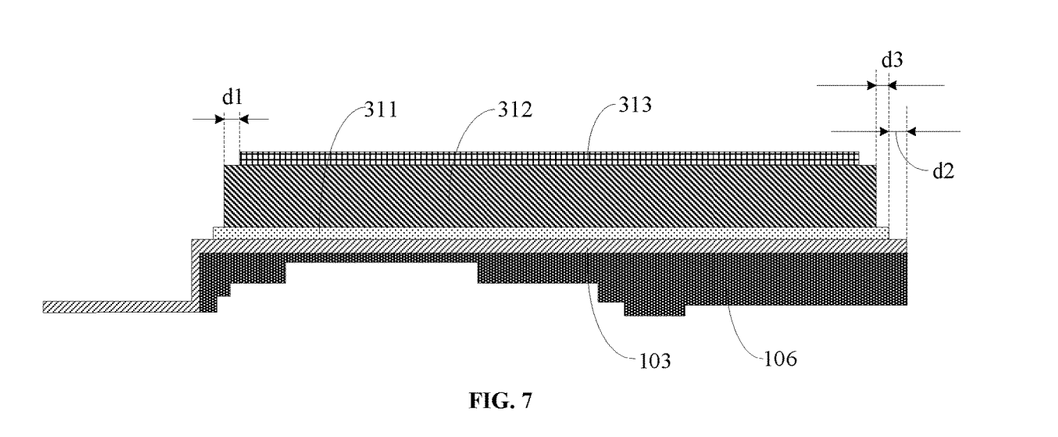
FIG. 7 is a sectional view of a partial structure of a display substrate according to an exemplary embodiment of the present disclosure.

In an embodiment, the orthographic projection of the photosensitive layer 312 of the photoelectric sensor 31 onto the substrate 10 is within the orthographic projection of the first electrode 311 onto the substrate 10. In this way, it can avoid the interference of ambient light to the photosensitive layer 312, thereby increasing the signal-to-noise ratio of the signal received by the photoelectric sensor 31. Referring to FIG. 7, a distance between the side wall of the photosensitive layer 312 and the side wall of the first electrode 311 is d3 and the range of d3 may be [1 μm, 3 μm]. Optionally, d3 may be 2 μm.

In an embodiment, an orthographic projection of the second electrode 313 onto the substrate 10 is within the orthographic projection of the photosensitive layer 312 onto the substrate 10. In this way, it is beneficial to reduce the dark current of the photoelectric sensor 31. Referring to FIG. 7, the distance between the side wall of the photosensitive layer 312 and the side wall of the second electrode 313 is d1 and the range of d1 may be [0.5 μm, 2.5 μm]. Optionally, d1 may be 1.5 μm.

In an embodiment, referring to FIG. 3, the planarizing layer 106 is disposed only under the photoelectric sensor 31, and the area of the orthographic projection of the planarizing layer 106 onto the substrate 10 is smaller than the area of the substrate 10. The material of the planarizing layer 106 may be a Silicon On Glass (SOG) material. The planarizing layer 106 made of the SOG material may make the bottom of the photoelectric sensor 31 flatter. Referring to FIG. 7, the distance between the side wall of the planarizing layer 106 and the side wall of the first electrode 311 is d2 and the range of d2 may be [2 μm, 4 μm]. Optionally, d2 may be 3 μm.

In an embodiment, when the planarizing layer 106 is made of the SOG material, the second passivation layer 107 covers a wall of the planarizing layer 106 distal from the substrate 10 and the side wall of the planarizing layer 106. In this way, the second passivation layer 107 can prevent the SOG material from polluting the equipment chamber during a subsequent manufacturing process of film layers, such as the respective film layers of the photoelectric sensor 31. In addition, the second passivation layer 107 can avoid etching of the planarizing layer 106 caused by the over-etching during the manufacture of the first electrode 311 of the photoelectric sensor 31, so as to avoid the problem caused by the higher dark current of the photoelectric sensor 31 arising from the side wall of the photoelectric sensor 31 being polluted by the SOG material.

In an embodiment, when the planarizing layer 106 is made of the SOG material, by disposing the orthographic projection of the first electrode 311 onto the substrate 10 to be within the orthographic projection of the planarizing layer 106 onto the substrate 10, the risk of film exposure arising from volatilization of silicon in the SOG material can be avoided.

In another embodiment, referring to FIG. 4, the planarizing layer 106 is a film layer deposited over the entire surface. That is, the projection of the planarizing layer 106 onto the substrate 10 covers the substrate 10. When the planarizing layer 106 is a film layer deposited over the entire surface, as compared to the structure in which the planarizing layer 106 is disposed only under the light-emitting device 21, a height difference between the first region 201 and the second region 202 of the light-emitting device 21 can be reduced, such that the climbing difficulty of the anode 211, the organic layer 212 and the cathode 213 is reduced, thereby reducing the risk of the occurrence of fracture in the anode 211, the organic layer 212 and the cathode 213. In addition, compared with the structure in which the planarizing layer 106 is disposed only under the light-emitting device 21, since the height difference between the first region 201 and the second region 202 of the light-emitting device 21 is smaller, the amount of a photoresist used in an exposure and development process in the manufacture of the photoelectric sensor 31 can be reduced. Since the photoresist and metal residues remaining on the side wall of the photoelectric sensor 31 are less, there is no need to perform a secondary exposure, which is helpful in reducing the number of mask plates and process complexity. Moreover, since the planarizing layer 106 is a film deposited over the entire surface, it is beneficial to prevent the process of manufacturing the photoelectric sensor 31 from influencing the transistor 32. Thus, bright spots on the panel are reduced, thereby improving the display effect.

Exemplarily, the material of the planarizing layer 106 is resin. Since the light transmittance of the resin is relatively high, the light emitted by the light-emitting device 21 may be emitted out through the planarizing layer 106.

In an embodiment, when the planarizing layer 106 is a film deposited over the entire surface, the second passivation layer 107 covers the planarizing layer 106. The second passivation layer 107 can avoid etching of the planarizing layer 106 caused by the over-etching during the manufacture of the first electrode 311 of the photoelectric sensor 31, thereby protecting the planarizing layer 106.

In an embodiment, the transistor 32 is disposed on a side of the insulating layer 110 proximal to the substrate 10, a contact hole 1100 is defined in the insulating layer 110, and the first electrode 311 of the photoelectric sensor 31 is electrically connected to the source electrode 324 of the transistor 32 through the contact hole 1100 in the insulating layer 110.

In an embodiment, an insulating layer 109 is disposed between the second electrode 313 of the photoelectric sensor 31 and the anode 211, and a through hole 1090 is formed in the insulating layer 109. The display substrate 100 further includes a lead wire 40, the lead wire 40 and the anode 211 are disposed in the same layer, one end of the lead wire 40 is electrically connected to the second electrode 313 through the through hole 1090 in the insulating layer 109, the other end of the lead wire 40 is electrically connected to a chip, and the chip performs optical compensation on the light-emitting device according to the received signal. The lead wire 40 may be directly electrically connected to the chip or indirectly electrically connected to the chip by means of other devices. The lead wire 40 and the anode 211 are disposed in a same layer. That is, the lead wire 40 and the anode 211 are the made of the same material, and are formed at the same time. Thus, the anode 211 and the lead wire 40 may be formed in a same process, which is helpful in simplifying the manufacturing process of the display substrate 10. The material of the insulating layer 109 may be resin.

In the illustrated embodiment, the second electrode plate 332 of the capacitor 33 and the first electrode 311 of the photoelectric sensor 31 are implemented by a same conductive block. That is, the conductive block is both used as the first electrode 311 of the photoelectric sensor 31, and as the second electrode plate 332 of the capacitor 33, so that it can form the capacitor 33 together with the first electrode plate 331. In other embodiments, the second electrode plate 332 of the capacitor 33 and the photoelectric sensor 31 may also be different conductive blocks.

In an embodiment, referring to FIGS. 3 and 4, the display substrate 100 may further include a light shielding layer 101 disposed between the substrate 10 and the active layer 321 of the transistor 32, a buffer layer 102 disposed between the light shielding layer 101 and the active layer 321, a gate insulating layer 103 disposed between the active layer 321 and a gate 322, an interlayer dielectric layer 104 disposed between the gate 322 and the source electrode 324, a third passivation layer 108 disposed between the second electrode 313 and the insulating layer 109, and a pixel definition layer 41 disposed between the lead wire 40 and the anode 211. The pixel definition layer 41 is provided with a pixel opening, which exposes a part of the anode 211 and the organic layer 212 is at least partially located in the pixel opening. The projection of the light shielding layer 101 onto the substrate 10 approximately coincides with the orthographic projection of the active layer 321 onto the substrate 10.

Figure 6:
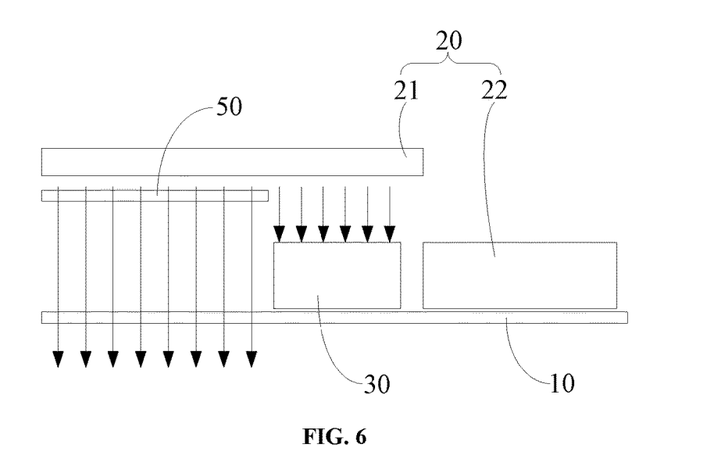
FIG. 6 is another schematic structural diagram of a display substrate according to an exemplary embodiment of the present disclosure.

Referring to FIG. 6, the display substrate further includes a color filter (CF) layer 50. In the embodiment shown in FIG. 6, the display substrate is a bottom light-emitting display substrate, the CF layer 50 is disposed between the light-emitting device 21 and the photoelectric sensor 31, and the orthographic projection of the CF layer 50 onto the substrate 10 does not overlap with the orthographic projection of the photoelectric sensor 31 onto the substrate 10. In other embodiments, the display substrate may be a top light-emitting display substrate, the CF layer is disposed on a side of the light-emitting device 21 distal from the substrate 10, and the orthographic projection of the CF layer onto the substrate does not overlap with the projection of the photoelectric sensor onto the substrate. In this way, the orthographic projection of the CF layer 50 onto the substrate 10 does not overlap with the orthographic projection of the photoelectric sensor 31 onto the substrate, and hence the light emitted by the light-emitting device and then received by the photoelectric sensor does not pass through the CF layer, such that the accuracy of the data detected by the photoelectric sensor is higher, thereby making the effect of optical compensation based on the data detected by the photoelectric sensor 31 better.

In an embodiment, the photoelectric sensor 31 is a photodiode. The photodiode is fast in response and provides more stable operation.

Figure 8:
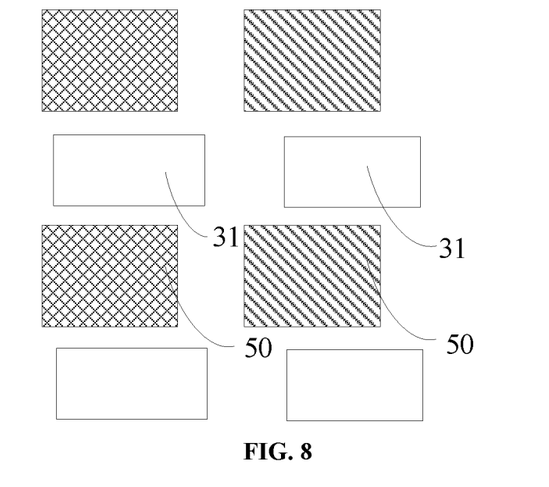
FIG. 8 is a diagram showing a positional relationship between a color filter layer and a photoelectric sensor according to an exemplary embodiment of the present disclosure.

In an embodiment, the display substrate includes a plurality of light-emitting structures, each being provided with a corresponding optical compensation structure at the side proximal to the substrate. FIG. 8 is a diagram showing a positional relationship between CF layers 50 and the photoelectric sensors 31 in this case. Referring to FIG. 8, different fillers represent color filters of different colors. FIG. 8 shows the color filters of four pixels which correspond to four optical compensation structures. That is, each light-emitting structure corresponds to one optical compensation structure. Meanwhile, the orthographic projection of the CF layer 50 onto the substrate does not overlap with the projection of the photoelectric sensor 31 onto the substrate.

Figure 9:
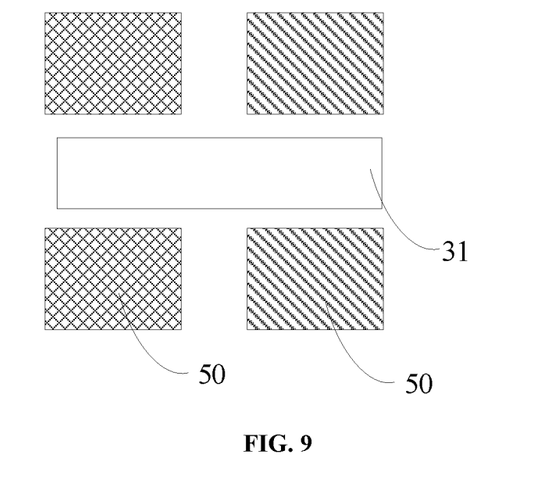
FIG. 9 is a diagram showing a positional relationship between a color filter layer and a photoelectric sensor according to an exemplary embodiment of the present disclosure.

In other embodiments, two or more adjacent light-emitting devices may share one optical compensation structure. For example, four light-emitting devices of the display substrate may share one optical compensation structure, so that the optical compensation structure can detect the luminance of the four light-emitting devices. FIG. 9 is a diagram showing a positional relationship between the CF layers 50 and the photoelectric sensor 31 in this case, and the difference with respect to FIG. 8 is that the four light-emitting structures share one optical compensation structure. In this way, the number of optical compensation structures in the display substrate can be reduced, which is helpful in reducing the complexity of the structure.

According to the embodiments of the present disclosure, a method for manufacturing a display substrate is provided. The display substrate includes a substrate 10, and a light-emitting device 21 and an optical compensation structure 30 which are disposed on the substrate 10. The optical compensation structure 30 includes a photoelectric sensor, a transistor and a capacitor. The photoelectric sensor includes a first electrode, a photosensitive layer and a second electrode. The transistor includes an active layer, a source electrode, a gate electrode and a drain electrode. The capacitor includes a first electrode plate and a second electrode plate.

Figure 10:
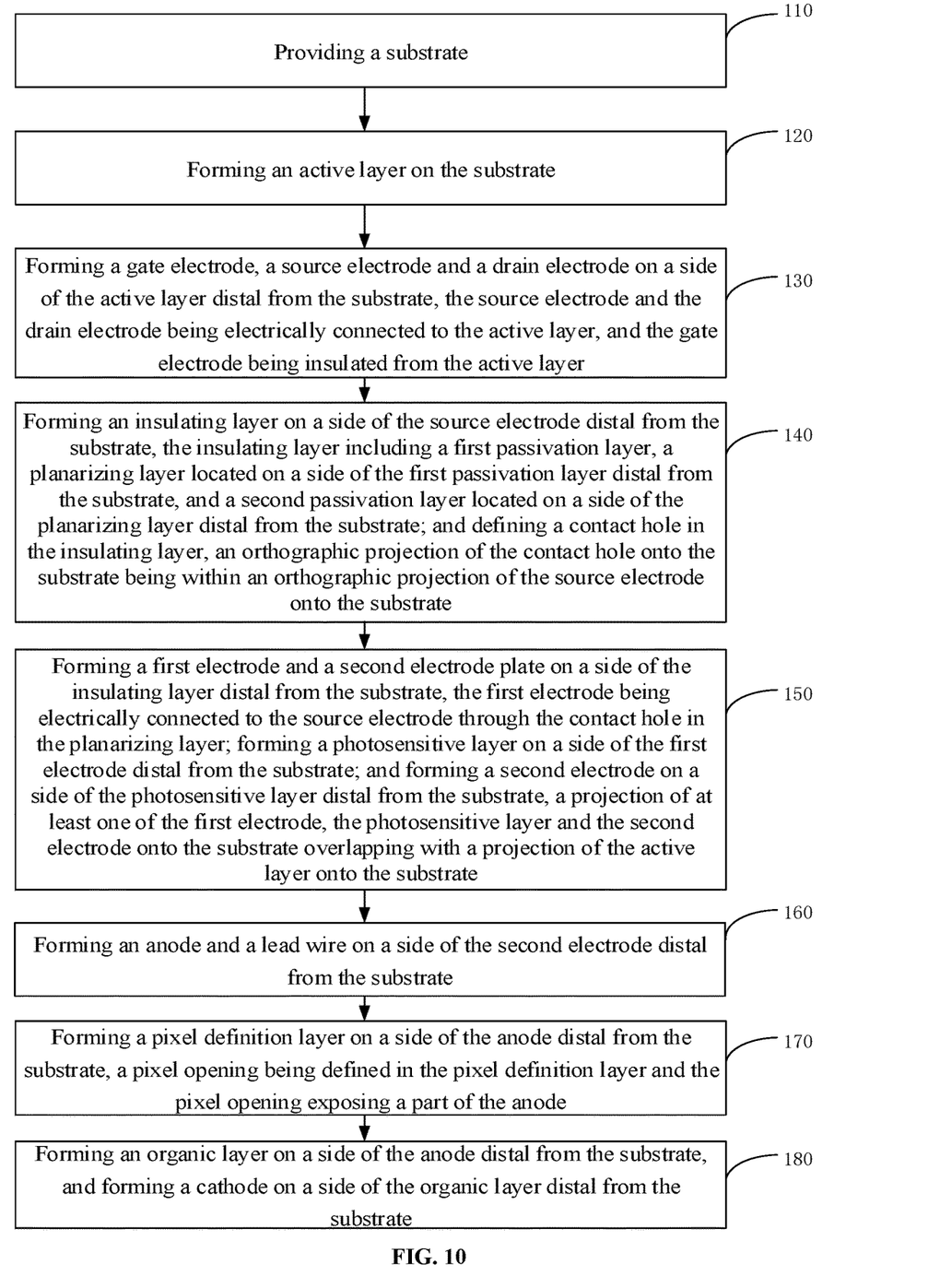
FIG. 10 is a flowchart showing a method for manufacturing a display substrate according to an exemplary embodiment of the present disclosure.

Referring to FIG. 10, the method for manufacturing the display substrate includes the following steps 110 to 180.

In step 110, a substrate is provided.

In an embodiment, the substrate 10 may be a flexible substrate or a rigid substrate. The flexible substrate may be a transparent substrate manufactured from one or more of PET (polyethylene terephthalate), PI (polyimide), PC (polycarbonate) and the like. The rigid substrate may be, for example, a transparent substrate such as a glass substrate, a quartz substrate, a plastic substrate or the like.

In step 120, an active layer is formed on the substrate.

Figure 11:
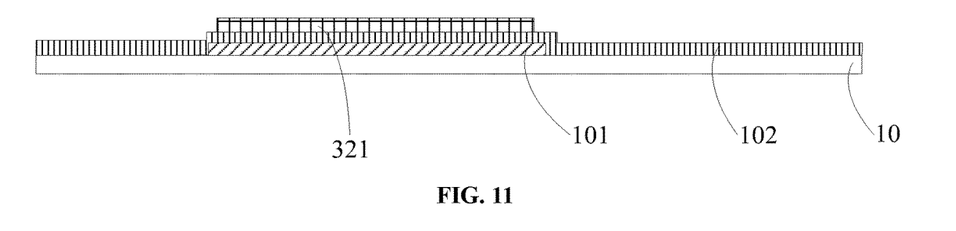
FIG. 11 is a sectional view of a first intermediate structure of a display substrate according to an exemplary embodiment of the present disclosure.

Prior to step 120, the manufacturing method further includes: forming a light shielding layer 101 on the substrate 10, and forming a buffer layer 102 on a side of the light shielding layer 101 distal from the substrate 10. The active layer 321 is disposed on a side of the buffer layer 102 distal from the substrate 10. An orthographic projection of the active layer 321 onto the substrate 10 is within an orthographic projection of the light shielding layer 101 onto the substrate 10.

A first intermediate structure as shown in FIG. 11 may be acquired through step 120.

In step 130, a gate electrode, a source electrode and a drain electrode are formed on a side of the active layer distal from the substrate, wherein the source electrode and the drain electrode are electrically connected to the active layer, and the gate electrode is insulated from the active layer.

Figure 12:
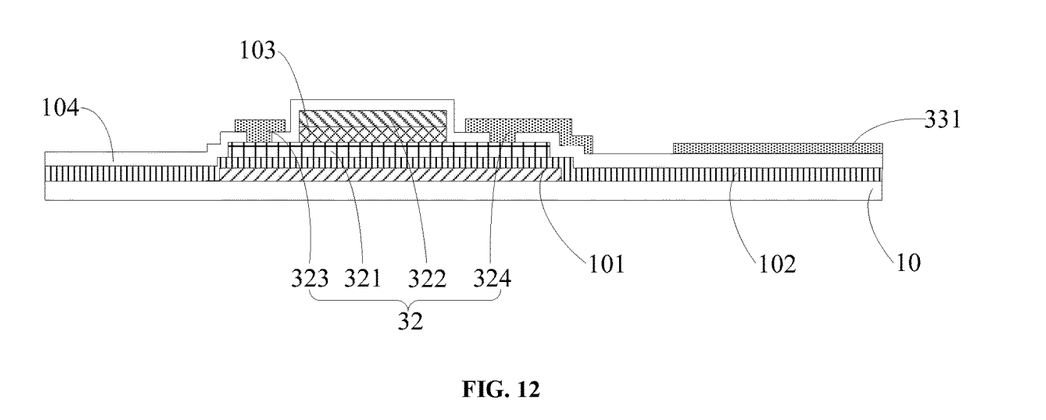
FIG. 12 is a sectional view of a second intermediate structure of a display substrate according to an exemplary embodiment of the present disclosure.

The step 130 may be implemented by the following steps: forming the active layer 321 on a side of the buffer layer 102 distal from the substrate 10; forming a gate insulating layer 103 on a side of the active layer 321 distal from the substrate 10; forming a gate electrode 322 on a side of the gate insulating layer 103 distal from the substrate 10; forming an interlayer dielectric layer 104 on a side of the gate electrode 322 distal from the substrate 10; forming a through hole in the interlayer dielectric layer 104, an orthographic projection of the through hole onto the substrate 10 being within the orthographic projection of the active layer 331 onto the substrate 10; forming the source electrode 324, the drain electrode 323 and the first electrode plate 331 of the capacitor 33 on a side of the interlayer dielectric layer 104 distal from the substrate 10, the source electrode 324 and the drain electrodes 323 being in contact with the active layer 321 through the corresponding through holes, respectively. A second intermediate structure as shown in FIG. 12 may be acquired through step 130.

In step 140, an insulating layer is formed on a side of the source electrode distal from the substrate, the insulating layer including a first passivation layer, a planarizing layer disposed on a side of the first passivation layer distal from the substrate, and a second passivation layer disposed on a side of the planarizing layer distal from the substrate; and a contact hole is defined in the insulating layer, an orthographic projection of the contact hole onto the substrate being within the orthographic projection of the source electrode onto the substrate.

Figure 13:
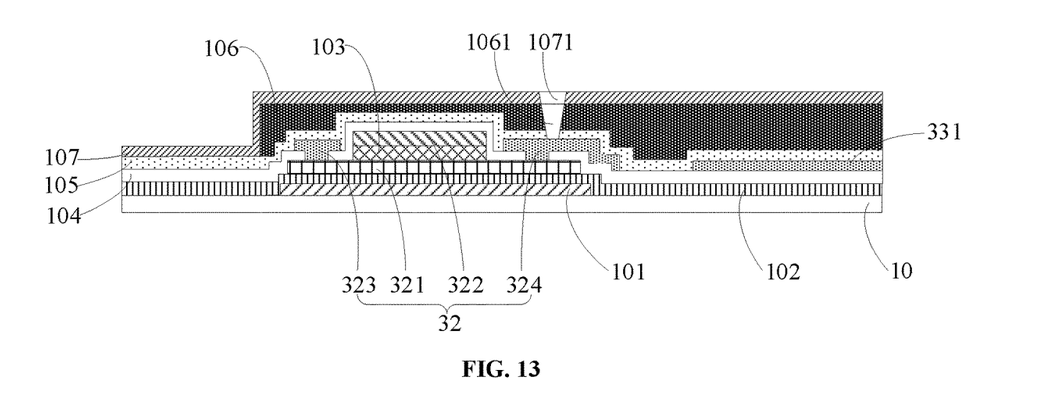
FIG. 13 is a sectional view of a third intermediate structure of a display substrate according to an exemplary embodiment of the present disclosure.
Figure 14:
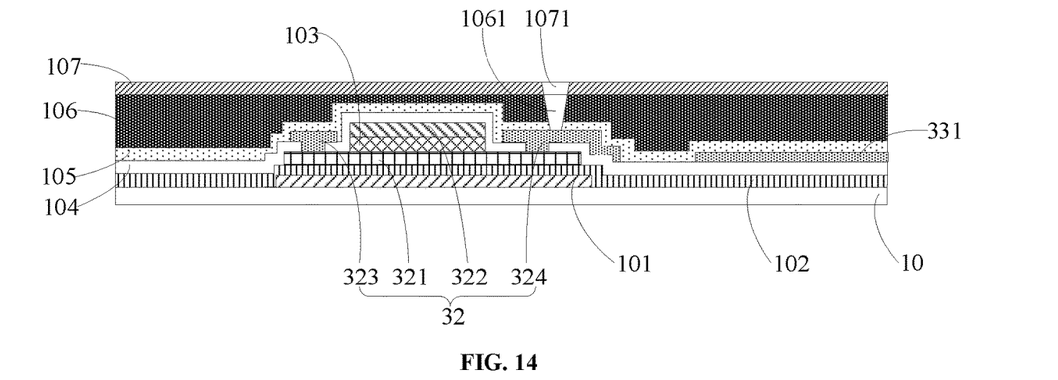
FIG. 14 is another sectional view of a third intermediate structure of a display substrate according to an exemplary embodiment of the present disclosure.

A third intermediate structure as shown in FIG. 13 or 14 may be acquired through step 140. In the third intermediate structure shown in FIG. 13, the area of the orthographic projection of the planarizing layer 106 onto the substrate 10 is smaller than the area of the substrate 10. In the third intermediate structure shown in FIG. 14, the orthographic projection of the planarizing layer 106 onto the substrate 10 covers the substrate 10.

In step 150, a first electrode and a second electrode plate are formed on a side of the insulating layer distal from the substrate, the first electrode being electrically connected to the source electrode through the contact hole in the planarizing layer; a photosensitive layer is formed on a side of the first electrode distal from the substrate; and a second electrode is formed on a side of the photosensitive layer distal from the substrate, the projection of at least one of the first electrode, the photosensitive layer and the second electrode onto the substrate overlapping with the projection of the active layer onto the substrate.

Figure 15:
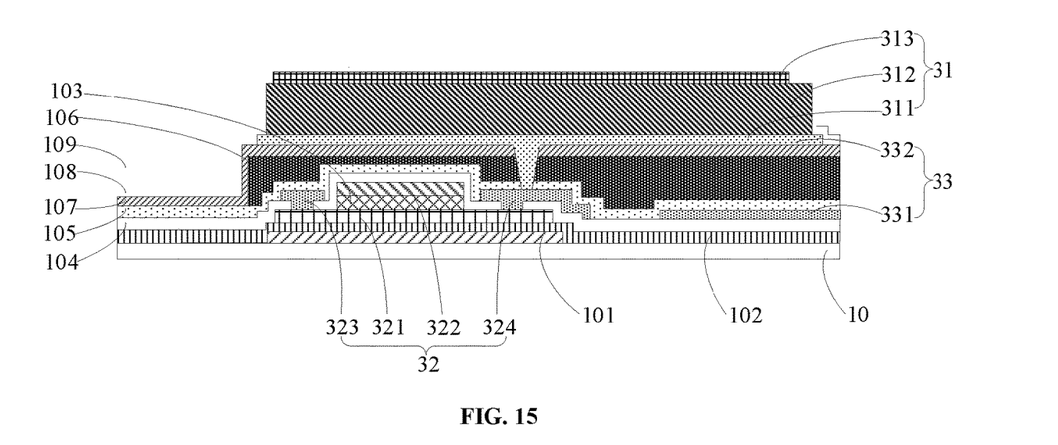
FIG. 15 is a sectional view of a fourth intermediate structure of a display substrate according to an exemplary embodiment of the present disclosure.

A fourth intermediate structure as shown in FIG. 15 may be acquired through step 150. FIG. 15 only shows an example in which the area of the orthographic projection of the planarizing layer 106 onto the substrate 10 is smaller than the area of the substrate 10, and the case in which the orthographic projection of the planarizing layer 106 onto the substrate 10 covers the substrate 10 is not illustrated.

Referring to FIG. 15, all of the orthographic projections of the first electrode 311, the photosensitive layer 312 and the second electrode 313 onto the substrate 10 are within the orthographic projection of the planarizing layer 106 onto the substrate 10. The orthographic projection of the photosensitive layer 312 onto the substrate 10 is within the orthographic projection of the first electrode 311 onto the substrate 10. The orthographic projection of the second electrode 313 onto the substrate 10 is within an orthographic projection of the photosensitive layer 312 onto the substrate 10.

In the illustrated embodiment, the second electrode plate 332 of the capacitor 33 and the first electrode 311 of the photoelectric sensor 31 are implemented by a same conductive block. That is, the conductive block is both used as the first electrode 311 of the photoelectric sensor 31 and as the second electrode plate 332 of the capacitor 33, so that it can the capacitor 33 together with the first electrode plate 332. In other embodiments, the second electrode plate 332 of the capacitor 33 and the photoelectric sensor 31 may be different conductive blocks.

In an embodiment, the orthographic projection of the active layer 321 of the transistor 32 onto the substrate 10 is within the projection of the photoelectric sensor 31 onto the substrate 10. That is, the orthographic projection of the active layer 321 of the transistor 32 onto the substrate falls within a set of the orthographic projections of the first electrode 311, the photosensitive layer 312 and the second electrode 313 onto the substrate. In this way, the space of the display substrate can be saved to the greatest extent, such that the light-emitting area of the display substrate is increased.

When forming the second electrode 313, a conductive layer is first deposited on the entire surface of a side of the photosensitive layer 312 distal from the substrate 10, and then, the conductive layer is patterned to form the second electrode 313. In an embodiment, the conductive layer may be patterned through an exposure and development process. In the exposure and development process, the amount of an applied photoresist is increased to avoid the case in which a large height difference exists between the conductive layer and the planarizing layer 106, the photoresist at the side wall of the photosensitive layer 312 is relatively thin and thus an over-etching condition appears during the process of etching the conductive layer.

Figure 16:
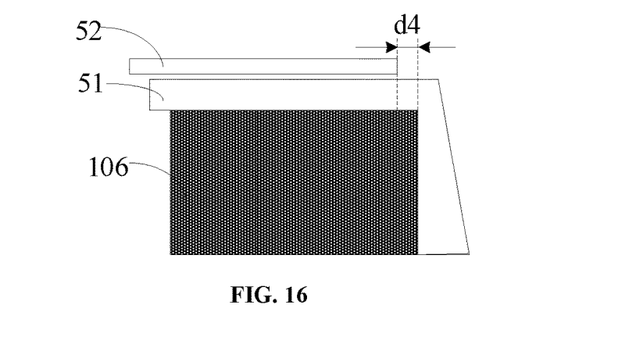
FIG. 16 is a schematic diagram of performing secondary exposure according to an exemplary embodiment of the present disclosure.

However, as the thickness of the photoresist increases, if conventional amount of ultraviolet light is used for exposure, the photoresist and the conductive layer will remain on the side wall of the passivation layer 107 and the wall of the passivation layer 107 distal from the substrate 10, the side wall of the first electrode 311 and the wall of the first electrode 311 distal from the substrate 10, and the side wall of the photosensitive layer 312 and the wall of the photosensitive layer 312 distal from the substrate 10. In order to avoid the residue of the photoresist and conductive layer, a secondary exposure may be performed on this region. In an exemplary embodiment, a mask plate with through holes corresponding to the region where the photoresist and the conductive layer remain may be disposed to cover the side of the conductive layer distal from the substrate 10, and then exposure is performed through the through hole of the mask plate. Referring to FIG. 16, the amount of the photoresist 51 on the side of the planarizing layer 106 is greater, and the distance d4 between the through hole of the mask plate 52 and the side wall of the planarizing layer 106 may be 2 μm, so as to ensure that the photoresist 51 is completely removed during the secondary exposure.

In step 160, an anode and a lead wire are formed on a side of the second electrode distal from the substrate.

Figure 17:
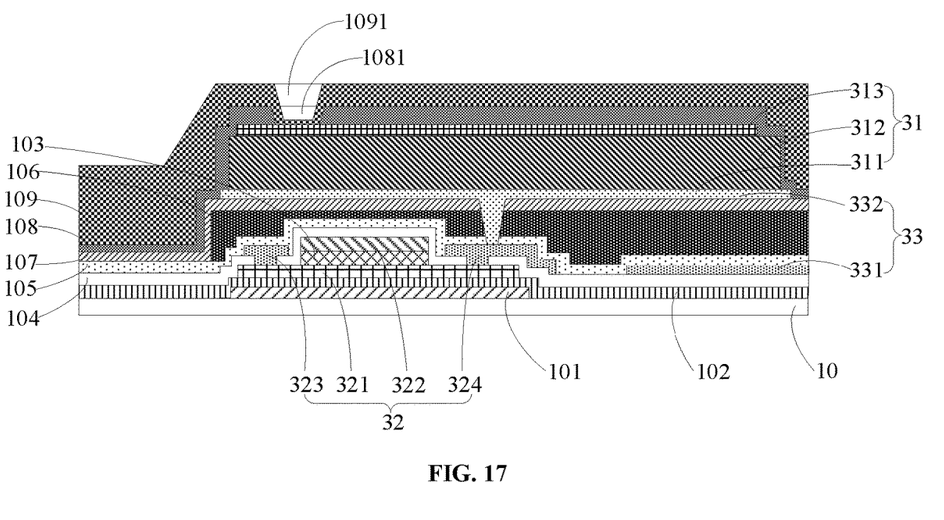
FIG. 17 is a sectional view of a fifth intermediate structure of a display substrate according to an exemplary embodiment of the present disclosure.

Prior to step 160, the manufacturing method may further include: forming a third passivation layer 108 on a side of the second electrode 313 distal from the substrate 10, forming an insulating layer 109 on a side of the third passivation layer 108 distal from the substrate 10, and defining a through hole 1081 in the third passivation layer 108 and a through hole 1091 in the insulating layer 109, wherein the through holes 1081 and 1091 are communicated with each other, and the two through holes may be formed simultaneously in the same step. The second electrode is disposed on a side of the insulating layer 109 distal from the substrate. An intermediate structure as shown in FIG. 17 may be acquired through this process. The lead wire 40 formed in step 160 is electrically connected to the second electrode 313 through the through hole 1081 in the third passivation layer 108 and the through hole 1091 in the insulating layer 109.

In step 170, a pixel definition layer is formed on a side of the anode distal from the substrate, wherein a pixel opening is defined in the pixel definition layer, and the pixel opening exposes a part of the anode.

In step 180, an organic layer is formed on a side of the anode distal from the substrate, and a cathode is formed on a side of the organic layer distal from the substrate.

The display substrate as shown in FIG. 3 or 4 may be acquired through step 180.

In the method for manufacturing the display substrate according to the embodiment of the present disclosure, the display substrate includes an optical compensation structure which collects the intensity of the light emitted by the light-emitting device to perform a luminance compensation on the light-emitting device, such that the luminous intensities of all the light-emitting devices in the display substrate are consistent, further making the luminance all over the display screen of the display substrate uniform. Since the optical compensation structure directly acquires the luminance difference among the respective light-emitting devices so as to perform the luminance compensation on them, the problem of non-uniform luminance caused by various factors can be solved. Compared with the solution of electrical compensation which can only solve the problem of non-uniform luminance caused by the threshold voltage and mobility, the solution according to the embodiment of the present disclosure provides a more comprehensive luminance compensation solution. As the source electrode and the drain electrode of the transistor and the first electrode plate of the capacitor are formed at the same time, and the first electrode of the photoelectric sensor and the second electrode plate of the capacitor are formed at the same time, such that the manufacturing process is simplified. The orthographic projection of the active layer of the transistor onto the substrate overlaps with the orthographic projection of the photoelectric sensor onto the substrate, such that the space of the display base plate is saved. When the size of the display substrate is fixed, the total light-emitting area of the light-emitting devices can be increased, which is helpful in improving the display effect.

With respect to the method embodiments, as they are basically corresponding to the products embodiments, the descriptions of the related details and beneficial effects may refer to the descriptions of the products embodiments, and are not repeated here.

According to the present disclosure, a display panel is further provided, wherein the display panel includes the display substrate according to any of the above embodiments. The display panel may further include an encapsulating layer, a polarizer, a glass cover plate, and the like.

According to the embodiments of the present disclosure, a display device is provided. The display device includes a shell and the above display panel, wherein the display panel is laid on the shell.

The display device in the present embodiment may be electronic paper, a mobile phone, a tablet computer, a TV, a notebook computer, a digital photo frame, a navigator, or any other product or component with a display function.

It should be pointed out that in the accompanying drawings, the dimensions of layers and regions may be exaggerated for the clarity of illustration. Moreover, it can be understood that when an element or a layer is referred to be "on" another element or layer, the element or layer may be directly disposed on the other element, or there may be an intermediate layer between the element or layer and the other element or layer. In addition, it can be understood that when an element or a layer is referred to be "under" another element or layer, the element or layer may be directly disposed under the other element, or there may be more than one intermediate layer or element between the element or layer and the other element or layer. In addition, understandably, when a layer or an element is referred to be "between" two layers or two elements, the layer or element may be the only one layer between the two layers or the two elements, or there may also be more than one intermediate layer or element between the two layers or the two elements. Like reference numerals indicate like elements throughout the text.

Other embodiments of the present disclosure may be recognized by those skilled in the art after considering the description and practice of the disclosure disclosed here. The present disclosure is intended to cover any variations, uses, or adaptations of the present disclosure following the general principles thereof and including such departures from the present disclosure as come within known or customary practice in the art. The description and the embodiments are to be considered as exemplary only, with a true scope and spirit of the present disclosure being indicated by the following claims.

It will be appreciated that the present disclosure is not limited to the exact constructions that have been described above and illustrated in the accompanying drawings, and that various modifications and changes can be made without departing from the scope thereof. It is intended that the scope of the present disclosure only be limited by the appended claims.

What is claimed is:

1. A display substrate, comprising:
a substrate; and
a light-emitting device and an optical compensation structure which are located on the substrate, wherein
the optical compensation structure comprises a photoelectric sensor, a transistor and a capacitor, and the photoelectric sensor is electrically connected to the transistor and the capacitor respectively;
the photoelectric sensor comprises a first electrode, a photosensitive layer located on a side of the first electrode distal from the substrate, and a second electrode located on a side of the photosensitive layer distal from the substrate; the transistor comprises a source electrode, a drain electrode, a gate electrode and an active layer; the capacitor comprises a first electrode plate and a second electrode plate located on a side of the first electrode plate distal from the substrate; and
neither an orthographic projection of the source electrode onto the substrate nor an orthographic projection of the drain electrode onto the substrate overlaps with an orthographic projection of the first electrode plate onto the substrate, and both the orthographic projection of the source electrode onto the substrate and the orthographic projection of the drain electrode onto the substrate overlap with an orthographic projection of the first electrode onto the substrate;
wherein the display substrate further comprises a color filter layer located between the light-emitting device and the photoelectric sensor, and an orthographic projection of the color filter layer onto the substrate does not overlap with an orthographic projection of the photoelectric sensor onto the substrate.

2. The display substrate according to claim 1, wherein an orthographic projection of the active layer onto the substrate overlaps with an orthographic projection of the photosensitive layer onto the substrate.

3. The display substrate according to claim 2, wherein the orthographic projection of the active layer onto the substrate is within the orthographic projection of the photosensitive layer onto the substrate.

4. The display substrate according to claim 1, wherein the source electrode, the drain electrode and the first electrode plate are located in a same layer.

5. The display substrate according to claim 1, wherein the first electrode and the second electrode plate are located in a same layer.

6. The display substrate according to claim 1, further comprising:
   an insulating layer located on a side of the photoelectric sensor proximal to the substrate, the insulating layer comprising a first passivation layer, a planarizing layer located on a side of the first passivation layer distal from the substrate, and a second passivation layer located on a side of the planarizing layer distal from the substrate.

7. The display substrate according to claim 6, wherein the transistor is located on a side of the insulating layer proximal to the substrate, a contact hole is defined in the insulating layer, and the first electrode and the source electrode are electrically connected through the contact hole.

8. The display substrate according to claim 6, wherein a material of the planarizing layer is one selected from a Silicon On Glass (SOG) material or a resin.

9. The display substrate according to claim 8, wherein the material of the planarizing layer is the SOG material, and the second passivation layer covers a surface of a side of the planarizing layer distal from the substrate and a side wall of the planarizing layer.

10. The display substrate according to claim 6, wherein an orthographic projection of the photoelectric sensor onto the substrate is within an orthographic projection of the planarizing layer onto the substrate.

11. The display substrate according to claim 1, wherein an orthographic projection of the photosensitive layer onto the substrate is within the orthographic projection of the first electrode onto the substrate.

12. The display substrate according to claim 1, wherein an orthographic projection of the second electrode onto the substrate is within an orthographic projection of the photosensitive layer onto the substrate.

13. The display substrate according to claim 1, wherein the light-emitting device is located on a side of the photoelectric sensor distal from the substrate, and the light-emitting device comprises an anode, an insulating layer is provided between the second electrode and the anode, and a through hole is defined in the insulating layer; and
   the display substrate further comprises a lead wire, the lead wire and the anode are located in a same layer, and one end of the lead wire is electrically connected to the second electrode through the through hole.

14. A display panel, comprising the display substrate according to claim 1.

15. A display device, comprising the display panel according to claim 14.

* * * * *